United States Patent [19]

Binet

[11] Patent Number: 4,954,774
[45] Date of Patent: Sep. 4, 1990

[54] AUTOMATIC CONTROL SYSTEM OF INTEGRATED CIRCUITS

[75] Inventor: Michel Binet, Tournan, France

[73] Assignee: U.S. Philips Corporation, New York, N.Y.

[21] Appl. No.: 366,106

[22] Filed: Jun. 13, 1989

[30] Foreign Application Priority Data

Jun. 24, 1988 [FR] France .................. 88 08502

[51] Int. Cl.$^5$ ............... G01R 35/00; G01R 31/06
[52] U.S. Cl. ................. 324/158 F; 324/158 P; 324/158 R
[58] Field of Search ........... 324/158 F, 158 P, 73 PC, 324/73 AT, 73 R, 158 R; 165/80.4, 80.5

[56] References Cited

U.S. PATENT DOCUMENTS

| | | | |
|---|---|---|---|
| 3,710,251 | 1/1973 | Hagge et al. | 324/158 F |
| 4,115,736 | 9/1978 | Tracy | 324/73 R |
| 4,346,754 | 8/1982 | Imig et al. | 165/80.5 |
| 4,607,220 | 8/1986 | Hollman | 324/158 F |
| 4,734,872 | 3/1988 | Eager et al. | 324/73 PC |
| 4,745,354 | 5/1988 | Fraser | 165/80.4 |
| 4,757,255 | 7/1988 | Margozzi | 324/158 F |
| 4,787,752 | 11/1988 | Fraser et al. | 324/158 F |
| 4,791,364 | 12/1988 | Kuffis et al. | 324/158 P |

Primary Examiner—Reinhard J. Eisenzopf
Assistant Examiner—Vinh P. Nguyen
Attorney, Agent, or Firm—Paul R. Miller

[57] ABSTRACT

A system of automatic control of integrated circuits, in which a wafer of integrated circuits (10) to be tested is supported by a sample carrier (61) and is electrically connected to a probe card (60). This system includes (a) a water-tight chamber (20) traversed by a flow or dry inert gas under excess pressure; (b) a mechanical assembly (40) of platforms (41, 42, 43, 44) for controlling the displacements of the wafer to be tested, with interpolation of a thermally insulated wedge (46) between the assembly of platforms and the sample carrier (61); and (c) a device (80) for cooling the sample carrier (61) internal of the system and including a container (81) of cooling liquid, a tube being prolonged in the cooling liquid to conduct the latter to a cooling cavity (63) internal of the sample carrier, and a device (64, 65) for exhausting the gaseous liquid appearing in the cooling cavity.

8 Claims, 1 Drawing Sheet

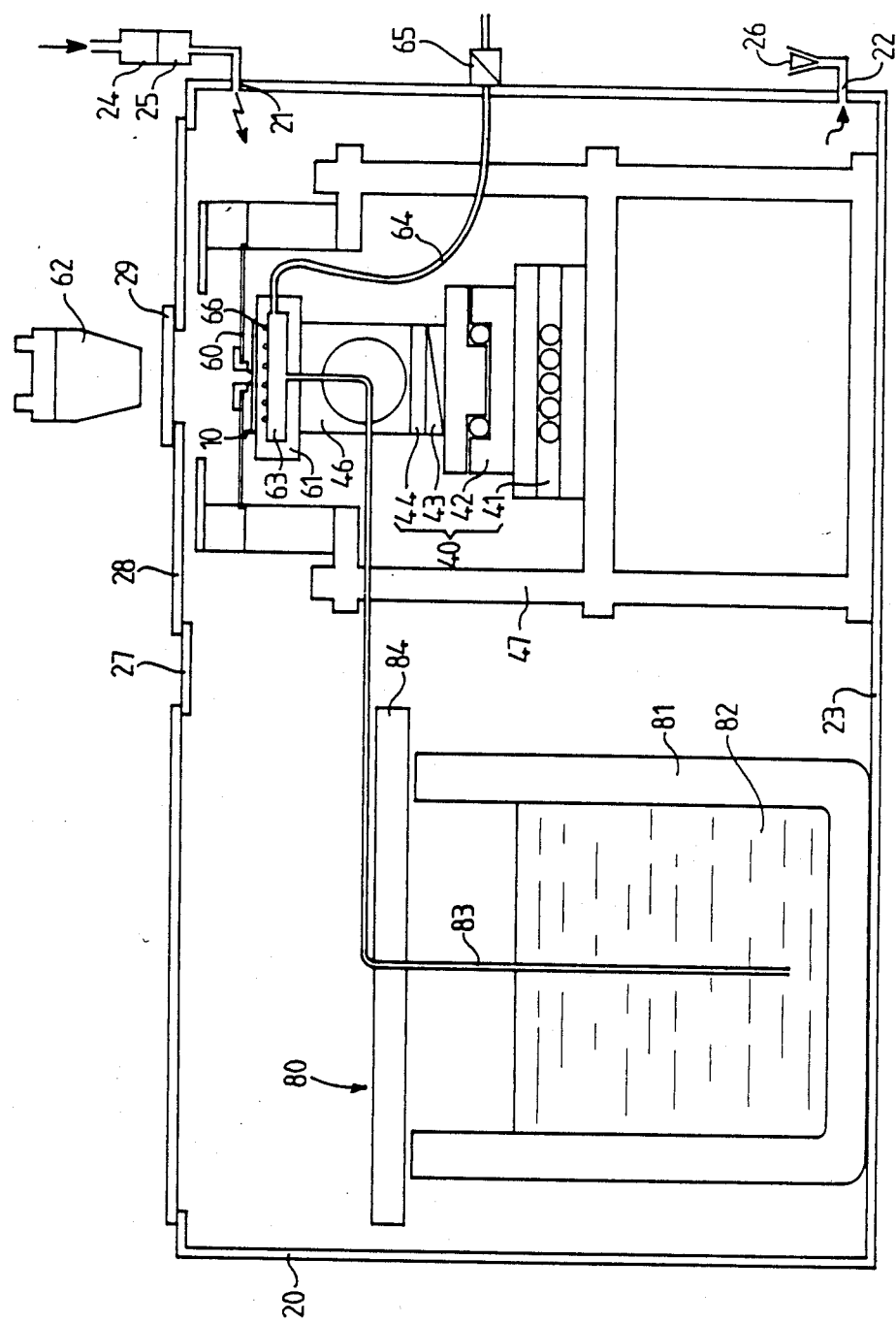

AUTOMATIC CONTROL SYSTEM OF INTEGRATED CIRCUITS

The present invention relates to an automatic testing system for integrated circuits on a wafer comprising:

a chamber with at least one inlet nozzle, to which a drying device and a heating device may be connected, for the introduction of an inert dry gas in the chamber, and with at least one exhaust nozzle to which a device may be connected for controlling and maintaining the gas within the chamber at an excess pressure;

a sample carrier inside the chamber to support the wafer;

a mechanical assembly capable of displacing the sample carrier and the probe card relative to each other in a controlled manner.

This system is particularly suitable for testing integrated circuits provided with superconducting materials.

It has been known since several decennia how to eliminate or to considerably reduce the electrical resistance of a conductor by cooling it very strongly. The qualities of the so-called superconducting materials open a variety of perspectives and especially permit to obtain electronic circuits particularly semiconductor circuits without thermal losses, which circuits can therefore be very small and operate at a very high speed.

However, such integrated circuits can only be used industrially if means are available for controlling the quality thereof. Testing of integrated circuits is carried out nowadays either at the ambient temperature or at higher temperatures by means of testing systems which can perform automatic displacements and permit the testing of millions of elements of integrated circuits on the same wafer without the intervention of an operator. However, really satisfactory systems, which permit realizing such tests at low temperature, do not exist. In fact, if the wafer with integrated circuits is cooled, the moisture in the air condenses and is deposited on the wafer in the form of water or ice, which makes electrical measurements impossible. So such measurements at low temperature can be carried out only on integrated circuits mounted in a package and arranged in a cryostat in which vacuum is created thus removing any trace of moisture. Consequently this process permits only tests on single devices, or at most a few devices, in contrast with the automatized testing system mentioned above which is able to measure automatically all the integrated circuits on the wafer.

U.S. Pat. No. 4757255 discloses a system of automatic control of integrated circuits permitting operation in an atmosphere of dry nitrogen to avoid the condensation and icing at low temperature. However, the device for cooling this system is provided by circulation of cold methanol, which is not capable of cooling below −60° C. and originates from an external circuit connected to the system by means of flexible supply tubes, which have the disadvantage of hardening at these temperatures.

The invention has for its object to obviate the limitations of this known system in that a system is proposed which has an improved cooling device and which operates at lower temperatures in an automatic manner, this providing a view for an efficient industrial control of the quality of the integrated circuits particularly those which are provided with superconducting materials.

According to the invention, a system of automatic testing integrated circuits is characterized in that a device comprises a container of cooling liquid provided with a cover and a tube being prolonged in the liquid to conduct the latter to a cooling cavity inside the sample carrier and that the cooling cavity is provided with an exhaust nozzle through which the liquid and its vapour can be discharged.

The structure according to the invention is advantageous in several respects. The technical solution which consists in that the cooling device is provided inside the chamber, avoids the mechanical problem mentioned above and can be carried out in a simple manner, compatible with the positioning of the devices for sweeping the internal volume of the vessel with slight excess pressure and of the means of fixing the slide to be tested on its support, in general by application of a vacuum to the back surface of the slice. The means adopted for this injection of cooling fluid for cooling the sample carrier are such that they permit the various translatory and/or rotary movements of the mechanical assembly of being carried out.

Otherwise, the use of a hollow sample carrier for the injection small quantities of liquid cooling fluid and its vaporization for cooling before testing, permits of operating and cooling in a simple and quick manner, which is useful if measurements should be carried out on the slices to be tested at different temperatures without loss of time.

The particulars of the invention will now appear in greater detail from the following description and from the accompanying FIGURE, given by way of non-limitative example, of an embodiment of the system according to the invention.

In the preferred embodiment shown in FIG. 1, the system according to the invention first comprises a chamber 20, which is permanently traversed by a flow of nitrogen (or of another dry gas permitting avoiding condensation or icing). The introduction of the gas is obtained by means of inlet nozzles 21 situated in the present case at the upper part of the chamber 20 in proximity of the wafer of integrated circuits 10 during test and its extraction is effected by means of exhaust nozzles 22 situated generally at the lower part of the chamber 20 close to the bottom 23. Only one of the inlet nozzles 21 and one of the exhaust 22 nozzles have been shown, but they are generally larger in number and distributed around the vessel. The gas, here nitrogen, used for this sweeping can be dried beforehand during passage through a drying device, such as a trap of liquid nitrogen 24 and then reheated by means of a resistance device 25. A slight excess pressure is maintained in the chamber 20 to avoid any infiltration of moist air into the latter, while the control of this excess pressure of the order of, for example, 20 mbar is ensured by a pressure limiter 26 connected to the exhaust nozzles 22.

Above the upper wall 27 of the chamber 20 is provided a hinged cover 28 provided in turn with a viewing-glass 29. The cover 28 permits access to the sample to be tested and the viewing-glass 29 permits carrying out by means of a microscope 62 an alignment between the wafer 10 to be tested and a probe card 60 of electrical connections to the wafer.

The wafer 10 is supported by a sample carrier 61 situated within the chamber 20 in its upper part. This sample carrier 61 is carried by a mechanical assembly 40 which comprises a stack of platforms 41, 42, 43, 44 performing in a quite usual manner an automatic movement by means of a motor. These platforms 41 to 44 control displacements X, Y, Z and θ, respectively, of the wafer 10 according to one or the other of the two horizontal axes and/or according to a vertical axis transverse to the preceding axes and/or a rotary displacement. The sampler carrier 61 having a deformation with temperature which is zero or negligible, is fixed on the assembly of platforms by means of a thermally insulating support 46 to avoid that the platforms are cooled. The displacement platforms are preferably positioned on a rigid stand 47 integral with the vessel 20.

Beside this mechanical assembly 40, a device 80 for cooling the sample carrier 61 is arranged. This device 80 internal of the system comprises an insulating container 81 filled, for example, with liquid nitrogen 82 or with any other cooling liquid. A tube 83 is prolonged in this container, which is intented to lead the nitrogen (or the liquid fluid) towards the sample carrier 61. This tube is made of a material having a low thermal conductivity. An insulating cover 84 integral with the tube 83 prevents or considerably limits the losses of liquid nitrogen (or fluid) by convection. The sample carrier 61 is hollow and its internal cavity 63 is connected to the container 81 of liquid nitrogen (or fluid) by the tube 83. The cavity 63 may moreover be provided with a system of obstacles or be filled, for example, with copper turns in order to favour vaporization of the liquid nitrogen (or fluid). The gaseous nitrogen (or fluid) thus formed is reheated to a temperature near the ambient temperature by passage through a reheater constituted by a tube in contact with an electrical resistor and is exhausted by means of a flexible pipe 64 and an electro-valve 65.

The operation of the system thus described is as follows. After positioning of the wafer 10 to be tested and of the probe card 60 associated therewith by opening the cover 28, the internal volume of the chamber is freed from any moist air by passage of a substantial flow of nitrogen (or gas used) which is dried and heated to increase its capacity of transporting water vapour. Simultaneously, the sample carrier 61 provided with a heating resistance 66 which is itself brought to a temperature of, for example, about 50° C., in order that it is dried too.

The flow of nitrogen (or gas) is then reduced to a considerably lower value, after which the sample carrier 61 is cooled to the desired test temperature by supplying to it through the tube 83 bursts of liquid nitrogen (fluid). The mere fact of opening the electro-valve 65 to the exterior causes a column of liquid nitrogen (or fluid) 82 to rise from the container 81 to the cavity 63 of the sample carrier 61, in which this nitrogen (or fluid) is vaporized while cooling the sample carrier. This supply is advantageously accelerated by pumping at the level of the electro-valve 65.

The desired tests can then be carried out while continuing to regulate the temperature of the sample carrier 61. This temperature regulation is effected by measuring the temperature of the sample carrier 61, by comparing it with a nominal temperature and by then acting upon the electro-valve 65 for reducing the temperature difference to a negligible value. Numerous ON/OFF regulators suitable for this application are commercially available. This kind of regulation by fluid has the advantage of not inducing a single parasitic electrical signal at the level of the wafer 10 to be tested.

When the tests once have terminated, the sample carrier 61 are reheated to the ambient temperature and then the cover 28 can be opened to recuperate the tested wafer 10 without a risk of icing.

The whole cycle of operations has been described with each stage in detail, but in general these operations are linked in an automatic manner under the control of a microprocessor or of an automat.

I claim:
1. A system for testing of integrated circuits on a wafer comprising
   (a) chamber means for enclosing wafer testing equipment,
   (b) at least one inlet nozzle means for introducing inert dry gas into said chamber means,
   (c) at least one exhaust nozzle means for exhausting said inert dry gas from said chamber means,
   (d) means connected to said at least one exhaust nozzle means for controlling and maintaining an excess pressure of said inert dry gas in said chamber means,
   (e) sample carrier means inside said chamber means for supporting a wafer having integrated circuits, said sample carrier means including a cooling cavity,
   (f) probe card means inside said chamber means for applying electrical connections to said wafer,
   (g) mechanical means inside said chamber means for displacing in a controlled manner said sample carrier means relative to said probe card means,
   (h) container means inside said chamber means for holding cooling liquid, said container means including a top cover, and
   (i) tube means extending through said top cover into said container means for conducting said cooling liquid from said container means to said cooling cavity, said tube means including further means for conducting liquid and vapor from said cooling cavity to an exhaust structure.
2. A system according to claim 1, wherein said sample carrier means is connected to said mechanical means by a thermally insulating support.
3. A system according to claim 1, wherein said inert dry gas is introduced and exhausted at a positive pressure.
4. A system according to claim 1, wherein said mechanical means includes a plurality of platforms to control displacements of said wafer.
5. A system according to claim 1, wherein said cooling liquid includes liquid nitrogen.
6. A system according to claim 1, wherein said further means includes means for controlling passage of said cooling liquid from said container means to said cooling cavity and from said cooling cavity to said exhaust structure.
7. A system according to claim 1, wherein said sample carrier means includes means for controlling temperature of said wafer free of electrical influences.
8. A method of operating a system according to claim 1, comprising the steps of
   (A) positioning said wafer relative to said probe card means,
   (B) drying interiors of said chamber means and said sample carrier means by circulating said inert dry gas and by heating said inert dry gas,
   (C) cooling said sample carrier means by vaporizing said cooling liquid in said cooling cavity,
   (D) carrying out tests on said wafer while regulating temperature of said sample carrier means, and
   (E) reheating said sample carrier means and removing said wafer from said chamber means.

* * * * *